United States Patent
Son et al.

(10) Patent No.: US 9,184,300 B2
(45) Date of Patent: Nov. 10, 2015

(54) TRANSISTOR, METHOD OF MANUFACTURING THE SAME, AND ELECTRONIC DEVICE INCLUDING TRANSISTOR

(75) Inventors: Kyoung-seok Son, Seoul (KR); Myung-kwan Ryu, Yongin-si (KR); Tae-sang Kim, Seoul (KR); Hyun-suk Kim, Hwaseong-si (KR); Joon-seok Park, Seongnam-si (KR); Jong-baek Seon, Yongin-si (KR); Sang-yoon Lee, Seoul (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 393 days.

(21) Appl. No.: 13/588,462

(22) Filed: Aug. 17, 2012

(65) Prior Publication Data
US 2013/0221343 A1   Aug. 29, 2013

(30) Foreign Application Priority Data

Feb. 29, 2012  (KR) .................. 10-2012-0021409

(51) Int. Cl.
*H01L 29/786*   (2006.01)
(52) U.S. Cl.
CPC ...... *H01L 29/78696* (2013.01); *H01L 29/7869* (2013.01); *H01L 29/78618* (2013.01); *H01L 29/78681* (2013.01)
(58) Field of Classification Search
CPC ............ H01L 2021/775; H01L 29/786; H01L 21/336; H01L 2021/78654; H01L 27/283; H01L 27/286; H01L 27/3244; H01L 27/3223; H01L 27/3251
See application file for complete search history.

(56) References Cited

U.S. PATENT DOCUMENTS

| | | | |
|---|---|---|---|
| 8,400,589 B2 * | 3/2013 | Lee | 349/110 |
| 2008/0258141 A1 * | 10/2008 | Park et al. | 257/43 |
| 2010/0008393 A1 * | 1/2010 | Enya et al. | 372/46.01 |
| 2010/0109002 A1 | 5/2010 | Itagaki et al. | |
| 2010/0176388 A1 * | 7/2010 | Ha et al. | 257/40 |
| 2010/0301340 A1 * | 12/2010 | Shih et al. | 257/59 |
| 2010/0301343 A1 | 12/2010 | Qiu et al. | |

FOREIGN PATENT DOCUMENTS

| | | |
|---|---|---|
| JP | 61-204976 | 9/1986 |
| JP | 07-169945 | 7/1995 |
| JP | 07-193222 | 7/1995 |

(Continued)

OTHER PUBLICATIONS

Office Action for corresponding European Application No. 12152631.1 dated May 6, 2013.
Kang-Jun Baeg et al. "Charge Injection Engineering of Ambipolar Field-Effect Transistors for High-Performance Organic Contemporary Circuits," *Applied Materials & Interfaces*, 2011, vol. 3, pp. 3205-3214.
Yan Ye, et al., "High mobility amorphous zinc oxynitride semiconductor material for thin film transistors", Journal of Applied Physics, 106, 074512 (2009), pp. 074512-1-074512-8.

*Primary Examiner* — Mohammad Choudhry
(74) *Attorney, Agent, or Firm* — Harness, Dickey & Pierce

(57) ABSTRACT

A transistor may include a hole blocking layer between a channel layer including oxynitride and an electrode electrically connected to the channel layer. The hole blocking layer may be disposed in a region between the channel layer and at least one of a source electrode and a drain electrode. The channel layer may include, for example, zinc oxynitride (ZnON). A valence band maximum energy level of the hole blocking layer may be lower than a valence band maximum energy level of the channel layer.

29 Claims, 14 Drawing Sheets

(56) References Cited

FOREIGN PATENT DOCUMENTS

| KR | 20060083065 A | 7/2006 |
|---|---|---|
| KR | 20080000691 A | 1/2008 |
| KR | 20090124527 A | 12/2009 |
| KR | 20100039738 A | 4/2010 |
| KR | 20100094817 A | 8/2010 |
| KR | 20110060479 A | 6/2011 |

* cited by examiner

TRANSISTOR, METHOD OF MANUFACTURING THE SAME, AND ELECTRONIC DEVICE INCLUDING TRANSISTOR

CROSS-REFERENCE TO RELATED APPLICATION

This application claims the benefit of Korean Patent Application No. 10-2012-0021409, filed on Feb. 29, 2012, in the Korean Intellectual Property Office, the disclosure of which is incorporated herein in its entirety by reference.

BACKGROUND

1. Field

The present disclosure relates to transistors, methods of manufacturing the same, and electronic devices including the transistors.

2. Description of the Related Art

Transistors are widely used as switching devices or driving devices in various electronic devices. Specifically, since a thin film transistor (TFT) may be manufactured on a glass substrate or a plastic substrate, TFTs are useful in a field related to display devices, such as liquid crystal display devices or organic light emitting display devices.

In order to improve operational characteristics of a transistor, a method of applying an oxide layer having high carrier mobility as a channel layer has been attempted. Such a method is mainly applied to a TFT for a display device.

SUMMARY

Provided are transistors including an oxynitride semiconductor as a channel layer material, and having excellent performance.

Provided are transistors capable of reducing hole conduction.

Provided are transistors having a low off-current.

Provided are transistors having a high sub-threshold slope.

Provided are methods of manufacturing the transistors.

Provided are electronic devices (e.g., display devices) including the transistors.

Additional aspects will be set forth in part in the description which follows and, in part, will be apparent from the description, or may be learned by practice of the presented embodiments.

According to an example embodiment, a transistor includes: a channel layer including an oxynitride semiconductor; a gate electrode corresponding to the channel layer; a source electrode connected to a first region of the channel layer; a drain electrode connected to a second region of the channel layer; and a hole blocking layer disposed between the channel layer and at least one of the source electrode and the drain electrode.

The oxynitride semiconductor may include zinc oxynitride (ZnON).

The oxynitride semiconductor may further include at least one metal element other than Zn.

The at least one metal element may include gallium (Ga), hafnium (Hf), aluminum (Al), indium (In), or tin (Sn), for example.

An energy band gap of the oxynitride semiconductor may be from about 1.3 eV to about 3.3 eV.

A valence band maximum energy level of the hole blocking layer may be lower than a valance band maximum energy level of the channel layer.

A sum of electron affinity and an energy band gap of the hole blocking layer may be greater than a sum of electron affinity and an energy band gap of the channel layer.

A conduction band minimum energy level of the hole blocking layer may be lower than or equal to a conduction band minimum energy level of the channel layer.

A conduction band minimum energy level of the hole blocking layer may be higher than a conduction band minimum energy level of the channel layer, and the hole blocking layer may have a thickness configured to allow tunneling of electrons. For example, the thickness may be lower than or equal to about 10 nm.

The hole blocking layer may be configured to reduce an off-current of the transistor.

The hole blocking layer may be configured to increase a sub-threshold slope of the transistor.

The hole blocking layer may include an oxide.

The oxide of the hole blocking layer may include at least one of zinc (Zn) oxide, indium (In) oxide, tin (Sn) oxide, titanium (Ti) oxide, gallium (Ga) oxide, zirconium (Zr) oxide, hafnium (Hf) oxide, InZn oxide, InSn oxide, ZnSn oxide, GaZn oxide, HfIn oxide, ZnTi oxide, InTi oxide, GaInZn oxide, HfInZn oxide, InZnSn oxide, InGaSn oxide, and mixtures thereof.

The hole blocking layer may include oxynitride.

The oxynitride of the hole blocking layer may be a same group as the oxynitride of the channel layer.

The oxynitride of the hole blocking layer may have a larger energy band gap than the oxynitride of the channel layer.

The oxynitride of the hole blocking layer may have a higher oxygen concentration than the oxynitride of the channel layer.

The hole blocking layer may include a non-oxide.

The hole blocking layer may include at least one of gallium nitride (GaN), gallium arsenide (GaAs), gallium phosphide (GaP), indium phosphide (InP), cadmium telluride (CdTe), cadmium sulfide (CdS), zinc selenide (ZnSe), zinc sulfide (ZnS), zinc telluride (ZnTe), aluminum arsenide (AlAs), aluminum gallium arsenide (AlGaAs), indium gallium phosphide (InGaP), gallium arsenide phosphide (GaAsP), and mixtures thereof.

The hole blocking layer may have a thickness of about 0.5 nm to about 500 nm.

The hole blocking layer may have a thickness of about 1 nm to about 20 nm.

The hole blocking layer may be between the channel layer and the source electrode, and the hole blocking layer is between the channel layer and the drain electrode.

The gate electrode may be disposed below the channel layer.

If the gate electrode is disposed below the channel layer, the transistor may further include an etch stop layer disposed on the channel layer.

The gate electrode may be disposed above the channel layer.

According to another aspect of an example embodiment, an electronic device includes the above transistor.

The electronic device may be a display device.

The display device may be a liquid crystal display device or an organic light emitting display device.

The transistor may be used as a switching device or a driving device.

BRIEF DESCRIPTION OF THE DRAWINGS

These and/or other aspects will become apparent and more readily appreciated from the following description of the embodiments, taken in conjunction with the accompanying drawings of which.

Figure 1:
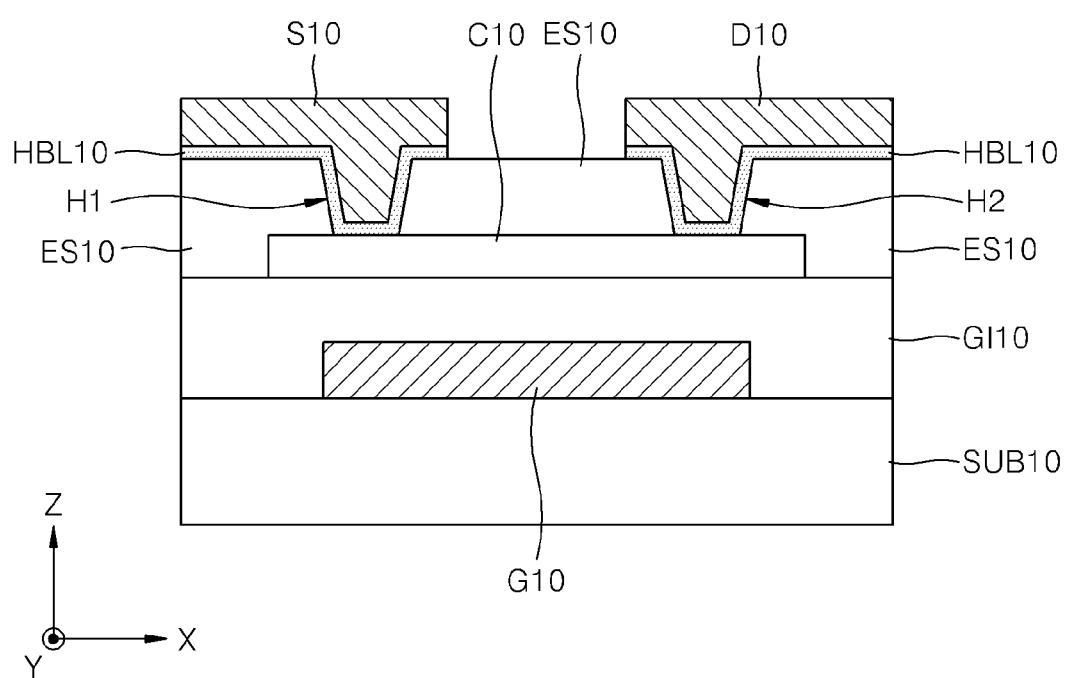
FIG. 1 is a cross-sectional view of a transistor according to an example embodiment.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The exemplary embodiments are described herein with reference to cross-sectional illustrations that are schematic illustrations of idealized embodiments (and intermediate structures) of the exemplary embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a transistor, a method of manufacturing the transistor, and an electronic transistor including the transistor according to example embodiments will be described in detail with reference to accompanying drawings. In the drawings, like reference numerals denote like elements, and the widths and thicknesses of layers and regions are exaggerated for clarity.

FIG. 1 is a cross-sectional view of a transistor according to an example embodiment. The transistor of the example embodiment is a thin film transistor (TFT) having a bottom gate structure, wherein a gate electrode G10 is disposed below a channel layer C10.

Referring to FIG. 1, the gate electrode G10 may be disposed on a substrate SUB10. The substrate SUB10 may be a glass substrate, and may alternatively be one of various substrates used in general semiconductor device processes, such as a plastic substrate or a silicon substrate, for example. The gate electrode G10 may be formed of a general electrode material, such as, for example, a metal or a conductive oxide. A gate insulation layer GI10 covering the gate electrode G10 may be disposed on the substrate SUB10. The gate insulation layer GI10 may include a silicon oxide layer, a silicon oxynitride layer, or a silicon nitride layer, and may alternatively include another material layer, such as, for example, a high dielectric material layer having a higher dielectric constant than a silicon nitride layer. The gate insulation layer GI10 may have a stacked structure, for example, in which at least two layers of a silicon oxide layer, a silicon oxynitride layer, a silicon nitride layer, and a high dielectric material layer are stacked on each other.

The channel layer C10 may be disposed on the gate insulation layer GI10. The channel layer C10 may be disposed above the gate electrode G10. A width of the channel layer C10 in an X-axis direction may be somewhat larger than a width of the gate electrode G10 in the X-axis direction. However, in some example embodiments, the width of the channel layer C10 may be similar to or smaller than the width of the gate electrode G10. The channel layer C10 may include an oxynitride semiconductor. For example, the channel layer C10 may include a zinc oxynitride (ZnON)-based semiconductor. According to an example embodiment, the channel layer C10 may be a ZnON layer. The ZnON may be represented as $Zn(1-x-y)O_xN_y$ (where $0<x<1$, and $0<y<1$), for example, but the empirical formula may differ. An energy band gap of the channel layer C10 may be greater than or equal to an energy band gap of $Zn_3N_2$, and may be smaller than or equal to an energy band gap of ZnO. When an amount of oxygen (O) in ZnON is small, an energy band gap of ZnON may be similar to the energy band gap of $Zn_3N_2$. When an amount of nitrogen (N) in ZnON is small, the energy band gap of ZnON may be similar to the energy band gap of ZnO. For example, the energy band gap of the channel layer C10 may be greater than or equal to about 1.3 eV and smaller than or equal to about 3.3 eV. In other words, the energy band gap of the channel layer C10 may be from about 1.3 eV to about 3.3 eV. The channel layer C10 may be a ZnON layer doped with a metal element (e.g., a metal element other than Zn). The metal element may be gallium (Ga), hafnium (Hf), aluminum (Al), indium (In), or tin (Sn), for example. The oxynitride semiconductor (ZnON or the like) forming the channel layer C10 may be amorphous or a mixture of amorphous and crystalline. A thickness of the channel layer C10 may be from about 10 nm to about 150 nm, or from about 30 nm to about 100 nm, for example. However, the thickness of the channel layer C10 may vary.

An etch stop layer ES10 covering the channel layer C10 may be disposed on the gate insulation layer GI10. The etch stop layer ES10 may prevent the channel layer C10 from being damaged during an etch process for forming a source electrode S10 and a drain electrode D10. The etch stop layer ES10 may include silicon oxide, silicon nitride, or an organic insulation material, for example. The etch stop layer ES10 may be used based on a material of the channel layer C10 and materials of the source and drain electrodes S10 and D10. The etch stop layer ES10 may include first and second contact holes H1 and H2 exposing first and second regions of the channel layer C10. The first region of the channel layer C10 may be one end of the channel layer C10 or a region adjacent to the end of the channel layer C10, and the second region of the channel layer C10 may be another end of the channel layer C10 or a region adjacent to the other end of the channel layer C10.

The source electrode S10 may be disposed in the first contact hole H1 of the etch stop layer ES10. The source electrode S10 may be electrically connected to the channel layer C10. The drain electrode D10 may be disposed in the second contact hole H2 of the etch stop layer ES10. The drain electrode D10 may be electrically connected to the channel layer C10. The source electrode S10 may be connected to the first region of the channel layer C10 exposed by the first contact hole H1, and the drain electrode D10 may be connected to the second region of the channel layer C10 exposed by the second contact hole H2. The source electrode S10 may have a structure and/or a portion thereof extending above the etch stop layer ES10 around the first contact hole H1, and similarly, the drain electrode D10 may also have a structure and/or a portion thereof extending above the etch stop layer ES10 around the second contact hole H2. The source and drain electrodes S10 and D10 may be formed of the same material as, or of a different material than, the gate electrode G10. The source and drain electrodes S10 and D10 may each be a single layer or a multi-layer, for example.

A hole blocking layer HBL10 may be disposed in at least one of a region between the channel layer C10 and the source electrode S10 and a region between the channel layer C10 and the drain electrode D10. In the example embodiment, the hole blocking layer HBL10 is disposed between the channel layer C10 and the source electrode S10, and between the channel layer C10 and the drain electrode D10. The hole blocking layer HBL10 may extend between the source electrode S10 and the etch stop layer ES10 and/or between the drain electrode D10 and the etch stop layer ES10. However, such a structure of the hole blocking layer HBL10 is only an example embodiment. For example, the hole blocking layer HBL10 may be disposed only between the channel layer C10 and the source and drain electrodes S10 and D10, and may not extend between the source and drain electrodes S10 and D10 and the etch stop layer ES10.

The hole blocking layer HBL10 may increase a potential barrier with respect to holes between the channel layer C10 and the source and drain electrodes S10 and D10. In this regard, a valence band maximum energy level EV of the hole blocking layer HBL10 may be lower than a valence band maximum energy level EV of the channel layer C10. Also, a sum of electron affinity and the energy band gap of the hole blocking layer HBL10 may be greater than a sum of electron affinity and the energy band gap of the channel layer C10. For example, when the channel layer C10 is a ZnON layer, the sum of the electron affinity and the energy band gap of the channel layer C10 may be about 5.6 eV, and thus the hole blocking layer HBL10 may be formed of a material wherein the sum of the electron affinity and the energy band gap is greater than 5.6 eV. Due to the hole blocking layer HBL10, conduction by holes, i.e., hole conduction, between the channel layer C10 and the source and drain electrodes S10 and D10 may be suppressed. In this regard, an off-current of a transistor may decrease and a sub-threshold slope may increase. The increase of the sub-threshold slope may mean reduction of a sub-threshold current. Various effects of the hole blocking layer HBL10 are hereinafter described in detail.

According to an example embodiment, the hole blocking layer HBL10 may include an oxide. In an example embodiment, the hole blocking layer HBL10 may include one of binary oxides, such as, for example, zinc oxide (ZnO), indium oxide (In2O3), tin oxide (SnO2), titanium oxide (TiO2), gallium oxide (Ga2O3), zirconium oxide (ZrO2), and hafnium oxide (HfO2), or ternary oxides or quaternary oxides formed from at least two oxides of the binary oxides. Examples of the ternary oxide may include InZn oxide (IZO), InSn oxide (ITO), ZnSn oxide (ZTO), GaZn oxide (GZO), HfIn oxide (HIO), ZnTi oxide (ZnTiO), and InTi oxide (InTiO), and examples of the quaternary oxide may include GaInZn oxide (GIZO), HfInZn oxide (HIZO), InZnSn oxide (IZTO), and InGaSn oxide (IGTO), for example. Alternatively, the hole blocking layer HBL10 may include a mixture of the above oxides.

According to an example embodiment, the hole blocking layer HBL10 may include oxynitride. In this case, the oxynitride of the hole blocking layer HBL10 may be the same group as the oxynitride of the channel layer C10. For example, the oxynitride of the hole blocking layer HBL10 may include ZnON. Here, the oxynitride of the hole blocking layer HBL10, for example, ZnON may have higher oxygen concentration than the oxynitride of the channel layer C10, for example, ZnON. When oxygen concentration of oxynitride (e.g., ZnON) is high, an energy band gap of the oxynitride may be high and a valence band maximum energy level EV may be low. Accordingly, the oxynitride, such as ZnON, of the hole blocking layer HLB10 may have a higher energy band gap than the oxynitride, such as, for example, ZnON, of the channel layer C10, and the valence band maximum energy level EV of the hole blocking layer HBL10 may be lower than the valence band maximum energy level EV of the channel layer C10. The oxynitride of the hole blocking layer HBL10 may be obtained by doping a predetermined metal element on ZnON, or may include oxynitride other than ZnON.

According to an example embodiment, the hole blocking layer HBL10 may include a non-oxide. In this case, the hole blocking layer HBL10 may include gallium nitride (GaN), gallium arsenide (GaAs), gallium phosphide (GaP), indium phosphide (InP), cadmium telluride (CdTe), cadmium sulfide (CdS), zinc selenide (ZnSe), zinc sulfide (ZnS), zinc telluride (ZnTe), aluminum arsenide (AlAs), and a compound thereof, such as, for example, aluminum gallium arsenide (AlGaAs), indium gallium phosphide (InGaP), and gallium arsenide phosphide (GaAsP). According to an example embodiment, the hole blocking layer HBL10 may include a mixture of the above non-oxides.

A valence band maximum energy level EV and an energy band gap Eg of oxides, oxynitrides, and non-oxides described as the material of the hole blocking layer HBL10 may differ according to compositions thereof. Thus, according to circumstances, the above materials may not be suitable for a material of the hole blocking layer HBL10 in terms of compositions and properties. Herein, it is assumed that the above materials have suitable compositions and properties to be applied to the hole blocking layer HBL10.

Meanwhile, a thickness of the hole blocking layer HBL10 may be from about 0.5 nm to about 500 nm, for example. For example, the thickness of the hole blocking layer HBL10 may be from about 1 nm to about 20 nm. When the hole blocking layer HBL10 is formed of an insulation material or a conduction band minimum energy level EC of the hole blocking layer HBL10 is higher than a conduction band minimum energy level EC of the channel layer C10, the hole blocking layer HBL10 may have a relatively small thickness lower than or equal to about 10 nm, for example, allowing tunneling of electrons. Since tunneling of holes is more difficult than tunneling of electrons, even if the hole blocking layer HBL10 has a thickness allowing the tunneling of electrons, the tunneling of holes through the hole blocking layer HBL10 may be reduced. Accordingly, a function of the hole blocking layer HBL10 whereby a flow of holes is suppressed may be maintained. Meanwhile, if the hole blocking layer HBL10 is formed of a semiconductor material or the conduction band minimum energy level EC of the hole blocking layer HBL10 is similar to or lower than the conduction band minimum energy level EC of the channel layer C10, electrons may flow easily even if the thickness of the hole blocking layer HBL10 is equal to or greater than 10 nm, for example.

Although not shown in FIG. 1, a passivation layer covering the hole blocking layer HBL10, the source electrode S10, and the drain electrode D10 may be further disposed on the etch stop layer ES10. The passivation layer may be a silicon oxide layer, a silicon oxynitride layer, a silicon nitride layer, or an organic insulation layer, or may have a structure, for example, where at least two layers thereof are stacked on each other.

Figure 2:
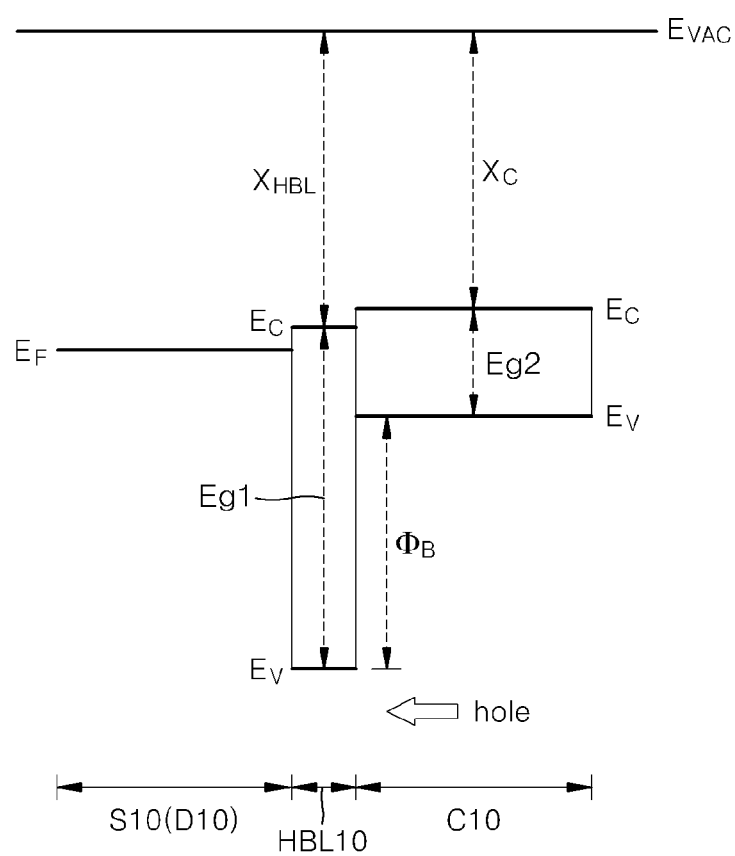
FIGS. 2 and 3 are energy band diagrams of a source electrode, a hole blocking layer, and a channel layer of the transistor of FIG. 1.

FIG. 2 is an energy band diagram of the source electrode S10, the hole blocking layer HBL10, and the channel layer C10 of the transistor of FIG. 1. In FIG. 2, reference notations EV and EC respectively denote a valence band maximum energy level and a conduction band minimum energy level, and reference notations EVAC and EF respectively denote a vacuum energy level and a Fermi energy level. The same reference notations are applied to FIG. 3.

Referring to FIG. 2, EV of the hole blocking layer HBL10 is lower than EV of the channel layer C10. This may mean that a sum (XHBL+Eg1) of electron affinity XHBL and an energy band gap Eg1 of the hole blocking layer HBL10 is greater than a sum (XC+Eg2) of electron affinity XC and an energy band gap Eg2 of the channel layer C10. Accordingly, a potential barrier ΦB with respect to holes is generated between the channel layer C10 and the source electrode S10 by the hole blocking layer HBL10. The potential barrier ΦB may suppress a flow of holes between the channel layer C10 and the source electrode S10, thereby suppressing or preventing problems that may arise due to hole conduction. As a result, an off-current of the transistor may decrease and a sub-threshold slope may increase.

Meanwhile, EC of the hole blocking layer HLB10 may be similar to or somewhat lower than EC of the channel layer C10. Accordingly, a flow of electrons between the channel layer C10 and the source electrode S10 may not be interfered with by the hole blocking layer HBL10. Instead, the flow of electrons between the channel layer C10 and the source electrode S10 may be eased by the hole blocking layer HBL10. However, EC of the hole blocking layer HBL10 may be, for example, higher than EC of the channel layer C10 as shown in FIG. 3.

Figure 3:
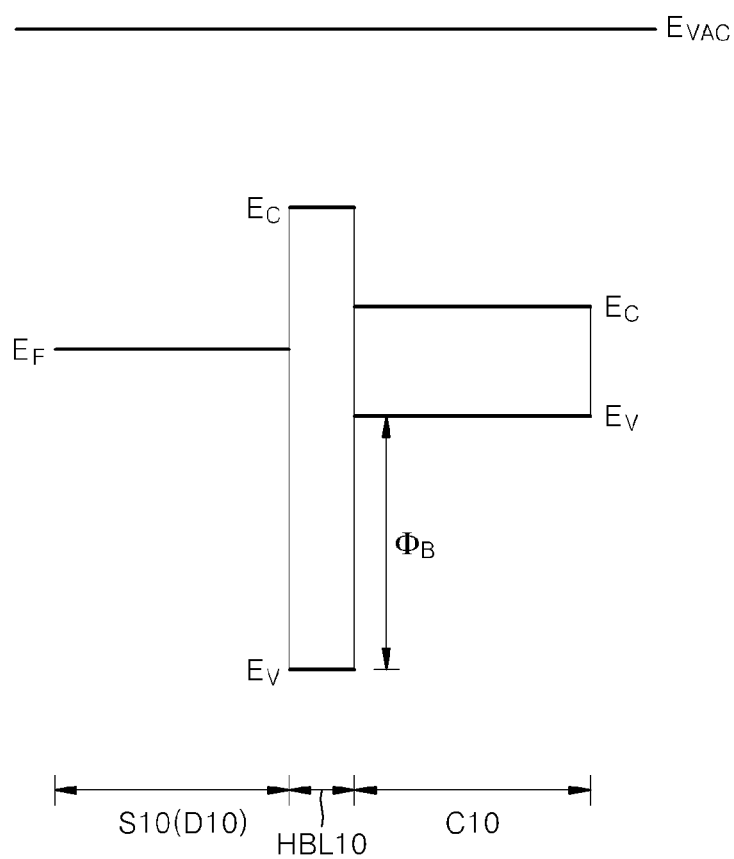

As shown in FIG. 3, when EC of the hole blocking layer HBL10 is higher than EC of the channel layer C10, the thickness of the hole blocking layer HBL10 may have a relatively thin thickness allowing tunneling of electrons, which may be, for example, a thickness lower than or equal to about 10 nm. When the thickness of the hole blocking layer HBL10 is relatively small, electrons between the channel layer C10 and the source electrode S10 may flow easily even if EC of the hole blocking layer HBL10 is higher than EC of the channel layer C10. Meanwhile, since tunneling of holes is more difficult than tunneling of electrons, tunneling of holes may not be easy even if the thickness of the hole blocking layer HBL10 is relatively small.

FIGS. 2 and 3 are energy band diagrams between the source electrode S10, the hole blocking layer HBL10, and the channel layer C10, and energy band diagrams between the drain electrode D10, the hole blocking layer HBL10, and the channel layer C10 may be similar thereto. In other words, since an energy band of the source electrode S10 and an energy band of the drain electrode D10 may be the same or similar, the energy band of the source electrode S10 in FIGS. 2 and 3 may be replaced by the energy band of the drain electrode D10.

An oxynitride semiconductor used in a transistor according to an example embodiment has different characteristics than an oxide semiconductor used in a general oxide transistor, as will be described in detail below with reference to FIGS. 4 through 6.

Figure 4:
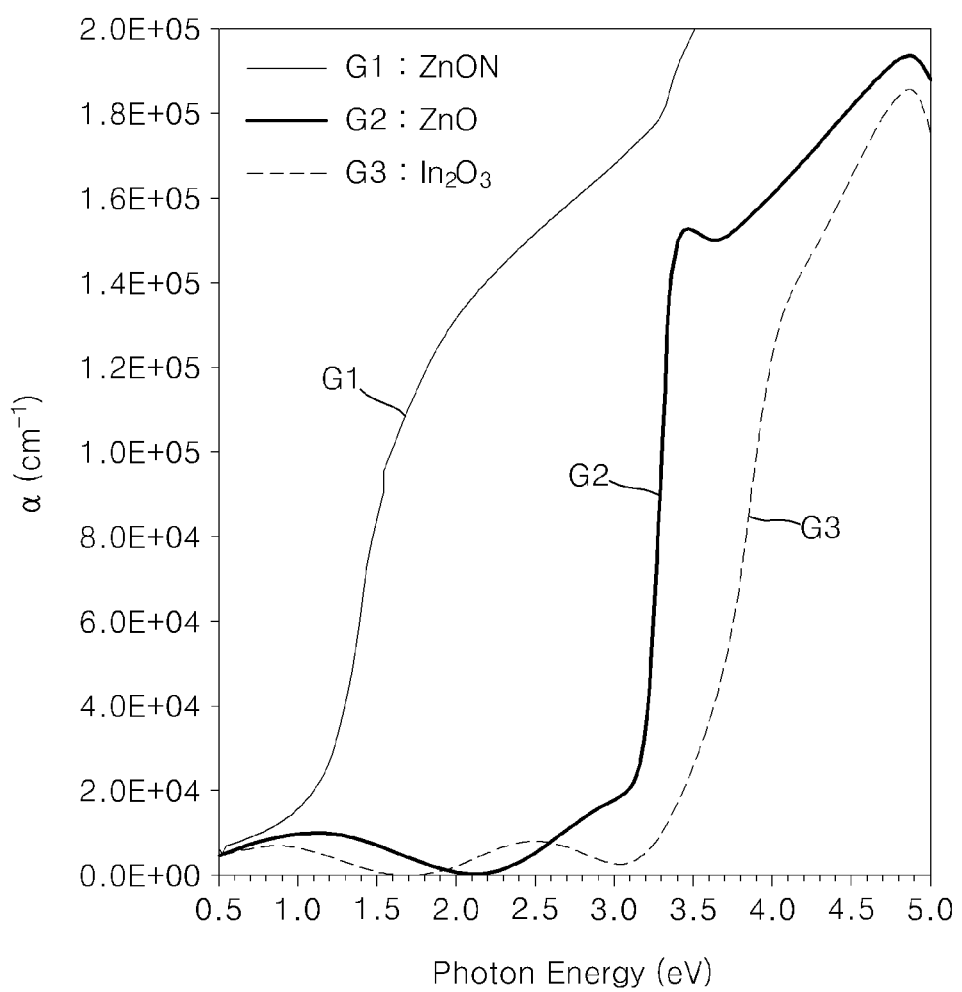
FIG. 4 is a graph showing an absorption coefficient according to photon energy of an oxynitride semiconductor (ZnON) and oxide semiconductors (ZnO and In2O3)

FIG. 4 is a graph showing an absorption coefficient α according to photon energy of an oxynitride semiconductor (ZnON) and oxide semiconductors (ZnO and In2O3). A first graph B1 is in relation to ZnON, a second graph G2 is in relation to ZnO, and a third graph G3 is in relation to In2O3. Here, ZnON is N-rich ZnON where an amount of N is higher than an amount of O.

Referring to FIG. 4, the first graph G1 is considerably sloping to the left compared to the second and third graphs G2 and G3. This shows that an optical energy band gap of the oxynitride semiconductor (ZnON) corresponding to the first graph G1 is considerably small compared to optical energy band gaps of the oxide semiconductors (ZnO and In2O3) corresponding to the second and third graphs G2 and G3. Based on the results shown in FIG. 4, the optical energy band gap of the oxide semiconductors (ZnO and In2O3) are about 3 eV, whereas the optical energy band gap of the oxynitride semiconductor (ZnON) is about 1.3 eV.

Also, since the oxide semiconductors (ZnO and In2O3) contain a lot of oxygen vacancy, a large amount of defect states exist at a deep level inside a band gap. Since an energy level of the defect state is directly above a valence band, it is difficult for the oxide semiconductors (ZnO and In2O3) to show characteristics of a p-type semiconductor. In other words, conduction by holes may not be generated in the oxide semiconductors (ZnO and In2O3). However, in the oxynitride semiconductor (ZnON), since the optical band gap is relatively small (i.e., about 1.3 eV) and a valence band is mainly formed of a p-orbital of N, a possibility of existence of a defect state due to oxygen vacancy at a deep level is low. Accordingly, generation of holes and conduction by holes may be relatively easy in the oxynitride semiconductor (ZnON). Thus, when the oxynitride semiconductor (ZnON) is applied as a channel material of a transistor, problems due to hole conduction may arise, as will be described below with reference to FIG. 5.

Figure 5:
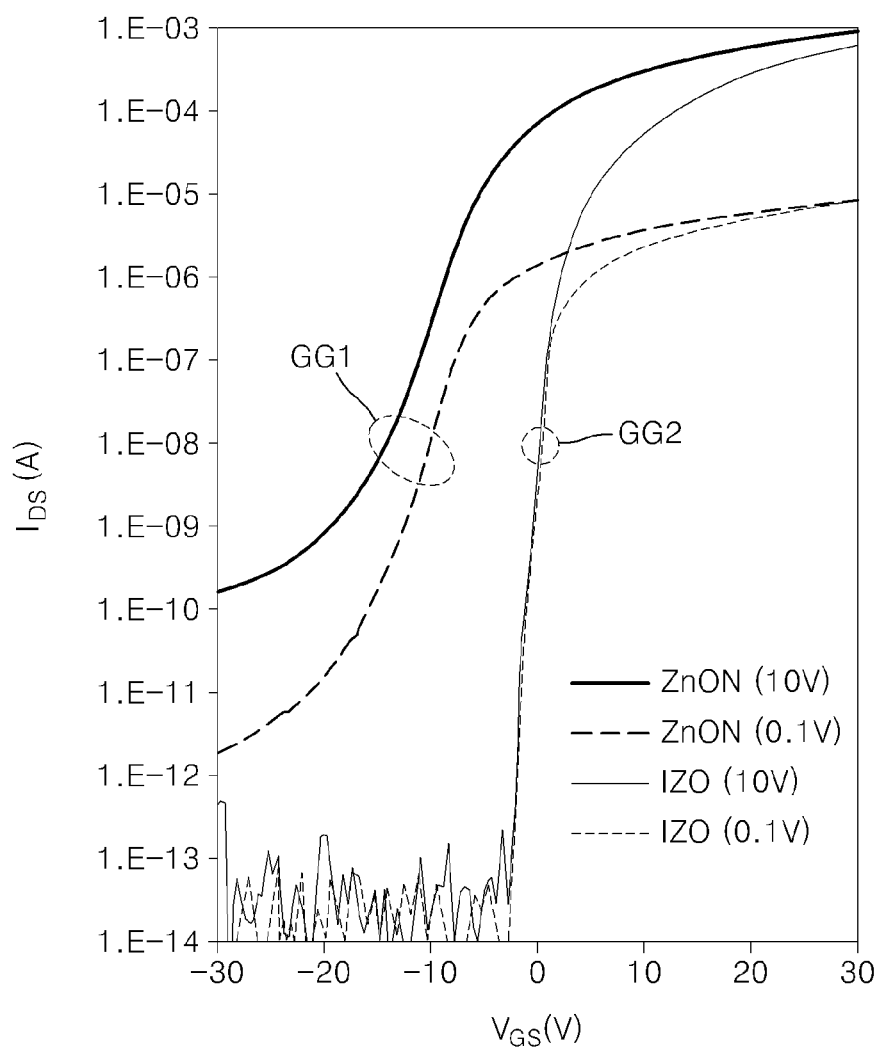
FIG. 5 is a graph showing gate voltage-drain current characteristics of a transistor according to an example embodiment using an oxynitride semiconductor (ZnON) as a channel material and a transistor using an oxide semiconductor (IZO) as a channel material.

FIG. 5 is a graph showing gate voltage (VGS)-drain current (IDS) characteristics of a transistor using an oxynitride semiconductor (ZnON) as a channel material and a transistor using an oxide semiconductor (IZO) as a channel material. Here, the transistors do not include the hole blocking layer HBL10 of FIG. 1. The gate voltage (VGS)-drain current (IDS) characteristics were measured by applying drain voltages VD of 0.1 V and 10 V to each of the transistors. In FIG. 5, a first graph GG1 is in relation to the transistor using the oxynitride semiconductor (ZnON) as a channel material and the second graph (GG2) is in relation to the transistor using the oxide semiconductor (IZO) as a channel material.

Referring to FIG. 5, the first graph GG1 using the oxynitride semiconductor (ZnON) as the channel material has a higher off-current and a smaller sub-threshold slope compared to the second graph GG2 using the oxide semiconductor (IZO) as the channel material. Specifically, according to the transistor using the oxynitride semiconductor (ZnON) as the channel material (the first graph GG1), the off-current remarkably increases as the drain voltage VD increases from 0.1 V to 10 V, which is considered to be an effect of the hole conduction.

FIG. 6A is a simulation result showing a gate voltage (VGS)-drain current (IDS) characteristic of a transistor using a channel layer having a small energy band gap and low defect state density at a deep level. FIG. 6A is a result in relation to the transistor using ZnON as the channel material described above (a hole blocking layer not used).

FIG. 6B is a simulation result showing a gate voltage (VGS)-drain current (IDS) characteristic of a transistor using a channel layer having a large energy band gap and high defect state density at a deep level. FIG. 6B is a result in relation to the transistor using IZO as the channel material (a hole blocking layer not used).

Referring to FIG. 6A, as the drain voltage VD increased from 0.1 V to 10 V, the off-current remarkably increased. This is because when the drain voltage VD increases to a predetermined level, conduction via holes is remarkably increased according to an increase in the gate voltage VGS in a negative direction. Alternatively, in FIG. 6B, the off-current does not increase even when the drain voltage VD increases.

Figure 6:
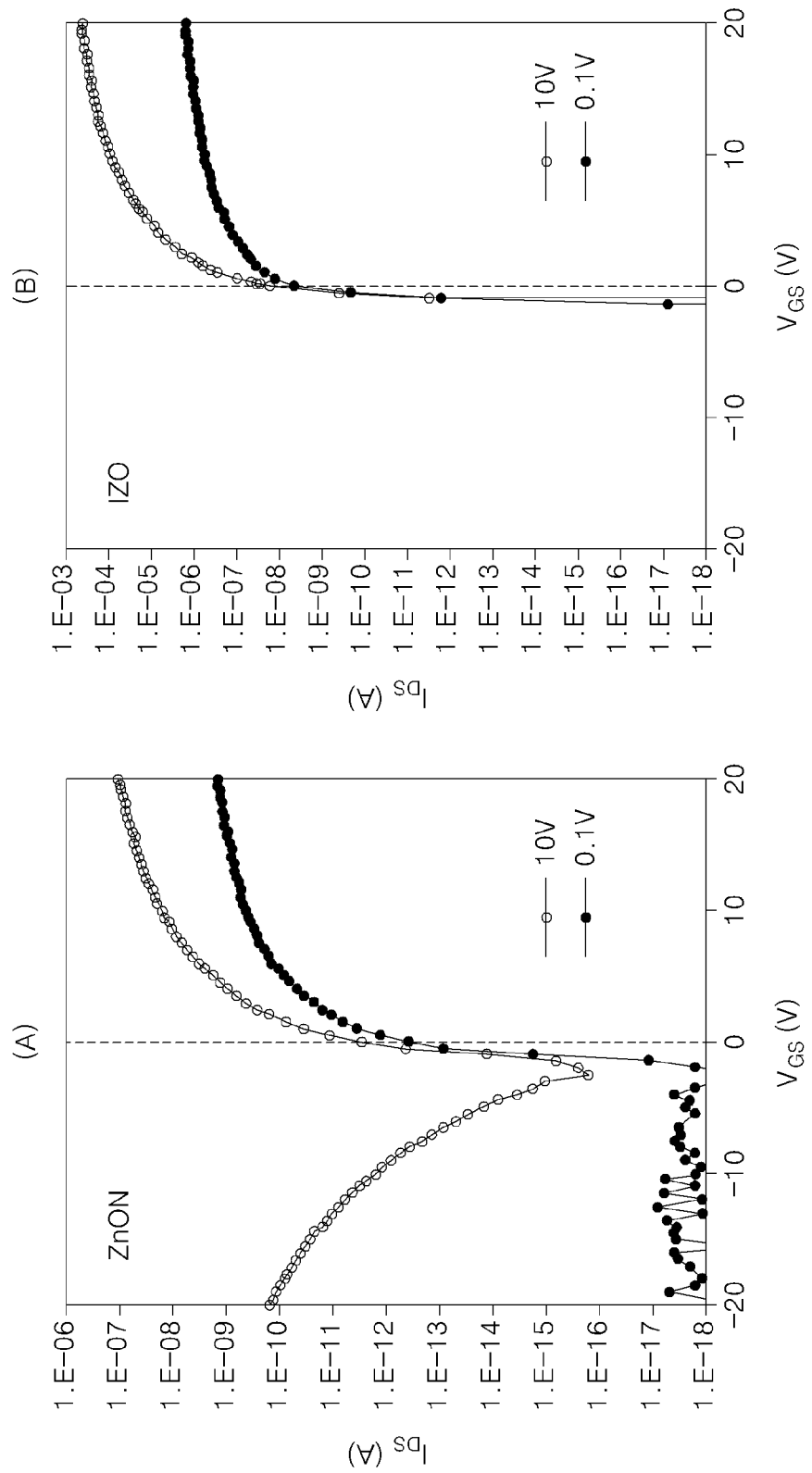
FIG. 6A is a simulation result showing a gate voltage-drain current characteristic of a transistor according to an example embodiment using a channel layer having a small energy band gap and low defect state density at a deep level.
FIG. 6B is a simulation result showing a gate voltage-drain current characteristic of a transistor according to an example embodiment, using a channel layer having a large energy band gap and high defect state density at a deep level.

Based on the results of FIGS. 4 through 6, the oxynitride semiconductor (ZnON) has clearly different characteristics from the oxide semiconductors (ZnO, In2O3, and IZO). Specifically in the oxynitride semiconductor (ZnON), conduction via holes may be easy, and thus the off-current of the transistor may increase and the sub-threshold slope may decrease.

In order to solve problems of the oxynitride semiconductor described above, the hole blocking layer HBL10 described with reference to FIG. 1 may be used. The problems due to the hole conduction of the oxynitride semiconductor may be suppressed/prevented by the hole blocking layer HBL10. Thus, according to an example embodiment, a transistor including an oxynitride semiconductor as a channel material and having excellent performance may be realized.

Figure 7:
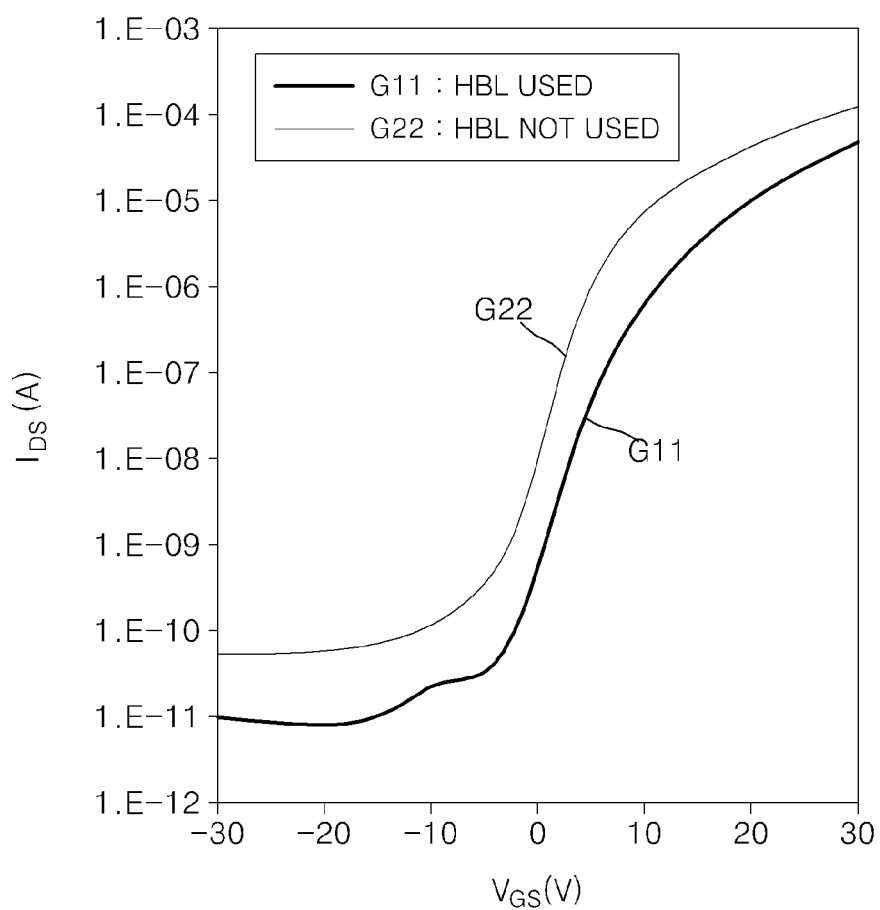
FIG. 7 is a graph showing gate voltage-drain current characteristics of transistors according to an example embodiment and a comparative example transistor.

FIG. 7 is a graph showing gate voltage (VGS)-drain current (IDS) characteristics of transistors according to an example embodiment and a comparative example. The transistor of the example embodiment has the structure shown in the example embodiment of FIG. 1, wherein a ZnON layer (thickness: 50 nm) is used as the channel layer C10 and a GZO layer (thickness: 20 nm) is used as the hole blocking layer HBL10. Meanwhile, the transistor of the Comparative Example does not use the hole blocking layer HBL10. Except that the hole blocking layer HBL10 is not used, the transistor of the comparative example has the same structure as the transistor of the example embodiment. A first graph G11 shows a result in relation to the transistor of the Embodiment and a second graph G22 shows a result in relation to the transistor of the comparative example.

Referring to FIG. 7, an off-current level of the first graph G11 corresponding to the transistor of the example embodiment (hole blocking layer used) is lower than an off-current level of the second graph G22 corresponding to the transistor of the comparative example (hole blocking layer not used) by about 1 order (i.e., about 10 times). Also, based on the results of FIG. 7, a sub-threshold slope of the first graph G11 is about 0.52 dec/V and a sub-threshold slope of the second graph G22 is about 0.45 dec/V. Meanwhile, an on/off current ratio of the first graph G11 is about 8.0×106 and an on/off current ratio of the second graph G22 is about 2.0×106. Accordingly, when the hole blocking layer HBL10 according to an example embodiment is used, the off-current of the transistor using the oxynitride semiconductor as the channel material may be reduced, the sub-threshold slope may be increased, and the on/off current ratio may be increased. Thus, according to an example embodiment, a transistor having excellent performance may be realized.

Since the transistor according to an embodiment has a low off-current and a high sub-threshold slope due to the hole blocking layer HBL10, a voltage VOFF for maintaining an off state of the transistor may be decreased. Also, since a leakage current of the transistor when a gate voltage is 0 V may be decreased, it may be easy to design a circuit using the transistor.

The structure of the transistor shown in FIG. 1 is only an example embodiment, and thus may vary. Modified example embodiments of the transistor of FIG. 1 are shown in FIGS. 8 and 9.

Figure 8:
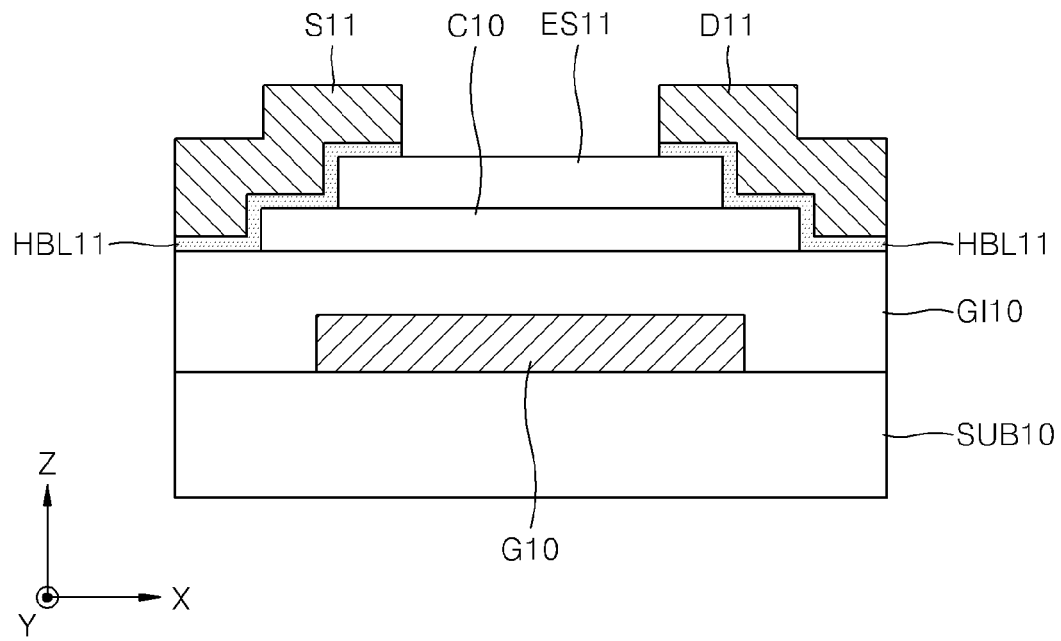
FIGS. 8 through 12 are cross-sectional views of transistors according to example embodiments.

Referring to FIG. 8, a gate electrode G10 and a gate insulation layer GI10 covering the gate electrode G10 may be disposed on a substrate SUB10, and a channel layer C10 may be disposed on the gate insulation layer GI10. An etch stop layer ES11 may be disposed on the channel layer C10. A width of the etch stop layer ES11 in an X-axis direction may be smaller than a width of the channel layer C10. Both ends of the channel layer C10 may not be covered by the etch stop layer ES11. A source electrode S11 may cover one end of the channel layer C10 and a portion of the etch stop layer ES11 adjacent to the end of the channel layer C10, and a drain electrode D11 may cover another end of the channel layer C10 and a portion of the etch stop layer ES11 adjacent to the other end of the channel layer C10. A hole blocking layer HBL11 may be disposed in at least one of a region between the channel layer C10 and the source electrode S11, and a region between the channel layer C10 and the drain electrode D11. In an example embodiment, the hole blocking layer HBL11 is disposed between the channel layer C10 and the source electrode S11, and/or between the channel layer C10 and the drain electrode D11. The hole blocking layer HBL11 may have a portion thereof extending between the source electrode S11 and the etch stop layer ES11 and/or between the source electrode S11 and the gate insulation layer GI10. Similarly, the hole blocking layer HBL11 may have a portion thereof extending between the drain electrode D11 and the etch stop layer ES11 and/or between the drain electrode D11 and the gate insulation layer ES11. A material, a thickness, and properties of the hole blocking layer HBL11 may be the same as or similar to the hole blocking layer HBL10 of FIG. 1.

Figure 9:
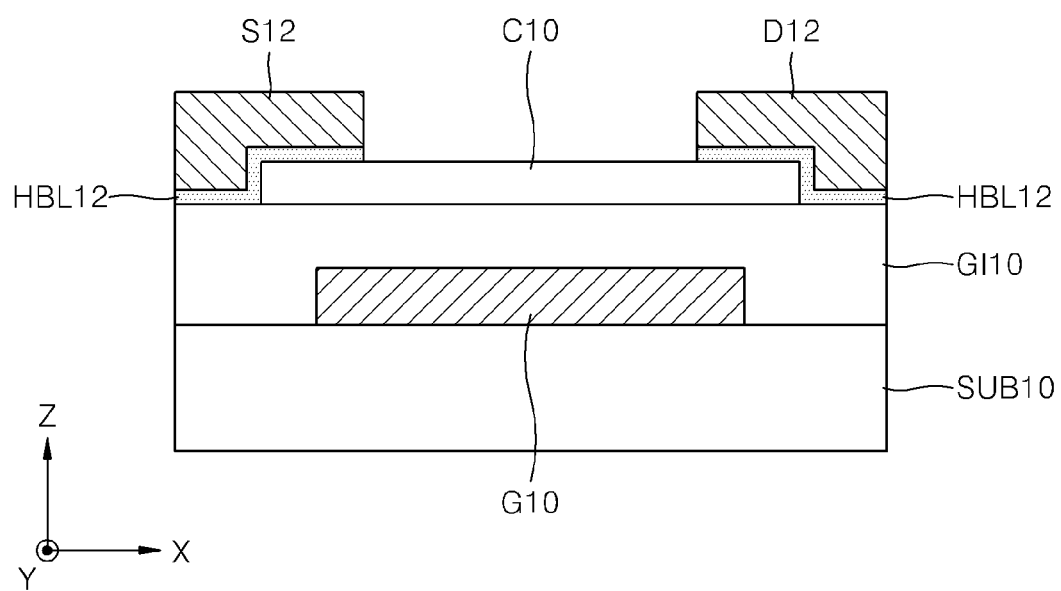

An etch stop layer ES11 may not be included according to an example embodiment shown in FIG. 9. Referring to FIG. 9, a source electrode S12 may cover one end of the channel layer C10, and a drain electrode D12 may cover another end of the channel layer C10, without an etch stop layer. A hole blocking layer HBL12 may be disposed in at least one of a region between the channel layer C10 and the source electrode S12, and a region between the channel layer C10 and the drain electrode D12.

Figure 10:
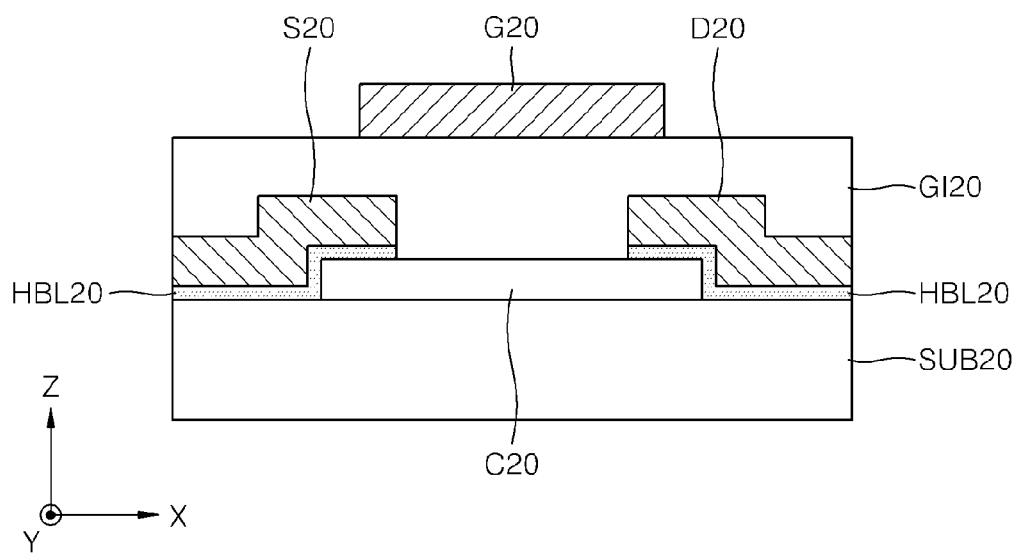

FIG. 10 is a cross-sectional view of a transistor according to an example embodiment. The transistor of the example embodiment has a top gate structure wherein a gate electrode G20 is disposed above a channel layer C20.

Referring to FIG. 10, the channel layer C20 may be disposed on a substrate SUB20. The channel layer C20 may be formed of the same or similar material (e.g., oxynitride semiconductor) as the channel layer C10 of FIG. 1. The channel layer C20 may include ZnON, for example. The channel layer C20 may include ZnON doped with a metal element (e.g., a metal element other than Zn). The metal element may be Ga, Hf, Al, In, Sn, or a combination thereof, for example. An energy band gap of the channel layer C20 may be greater than or equal to an energy band gap of $Zn_3N_2$, and may be smaller than or equal to an energy band gap of ZnO. The energy band gap of the channel layer C20 may be from about 1.3 eV to about 3.3 eV, for example. A source electrode S20 and a drain electrode D20 may be respectively connected to first and second regions of the channel layer C20. The source electrode S20 may cover one end of the channel layer C20 while extending to a region of the substrate SUB20 adjacent to the end of the channel layer C20. The drain electrode D20 may cover another end of the channel layer C20 while extending to a region of the SUB20 adjacent to the other end of the channel layer C20. A hole blocking layer HBL20 may be disposed in at least one of a region between the channel layer C20 and the source electrode S20, and a region between the channel layer C20 and the drain electrode D20. A material, a thickness, and properties of the hole blocking layer HBL20 may be the same as or similar to those of the hole blocking layer HBL10 of FIG. 1, for example. A gate insulation layer GI20 covering the channel layer C20, the source electrode S20, and the drain electrode D20 may be disposed on the substrate SUB20. The gate electrode G20 may be disposed on the gate insulation layer GI20. A passivation layer (not shown) covering the gate electrode G20 may be further disposed on the gate insulation layer GI20.

Materials, thicknesses, etc. of the substrate SUB20, the channel layer C20, the source electrode S20, the drain electrode D20, the gate insulation layer GI20, and the gate electrode G20 of FIG. 10 may be respectively the same as or similar to those of the substrate SUB10, the channel layer C10, the source electrode S10, the drain electrode D10, the gate insulation layer GI10, and the gate electrode G10 of FIG. 1.

Figure 11:
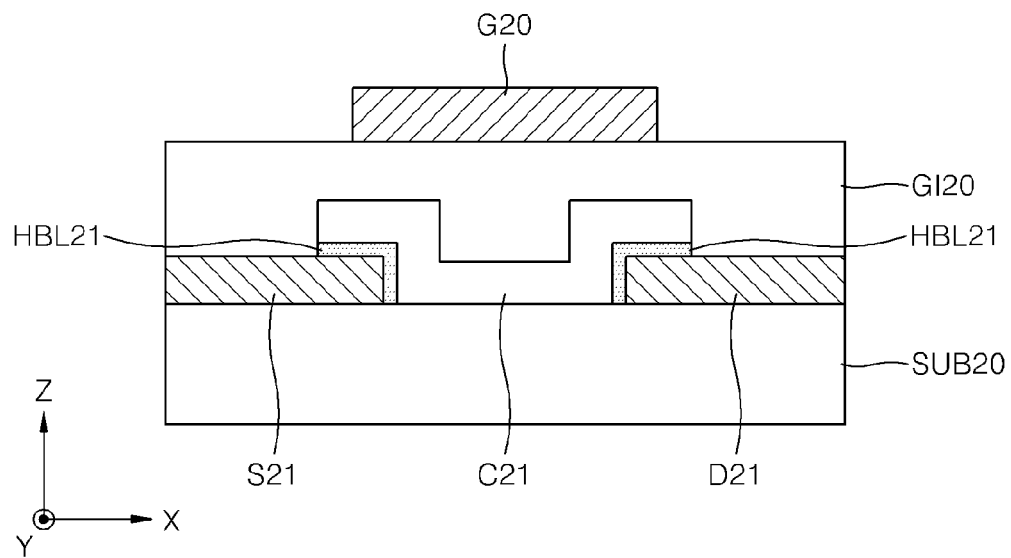

Locations of the channel layer C20, the source electrode S20, and the drain electrode D20 of FIG. 10 may be modified as shown in FIG. 11.

Referring to FIG. 11, a source electrode S21 and a drain electrode D21, which are spaced apart from each other, may be disposed on a substrate SUB20. A channel layer C21 may be disposed on the substrate SUB20 between the source and drain electrodes S21 and D21. The channel layer C21 may be connected to the source and drain electrodes S21 and D21. The channel layer C21 may cover ends of the source and drain electrodes S21 and D21, which face each other (i.e., opposite each other or proximal to each other). The channel layer C21 may include an oxynitride semiconductor including, for example, ZnON. The channel layer C21 may be obtained by doping a metal element (a metal element other than Zn) on ZnON. An energy band gap of the channel layer C21 may be from about 1.3 eV to about 3.3 eV. A hole blocking layer HBL21 may be disposed in at least one of a region between the channel layer C21 and the source electrode S21 and a region between the channel layer C21 and the drain electrode D21. A gate insulation layer GI20 covering the channel layer C21, the source electrode S21, and the drain electrode D21 may be disposed on the substrate SUB20. A gate electrode G20 may be disposed on the gate insulation layer GI20. A passivation layer (not shown) covering the gate electrode G20 may be further disposed on the gate insulation layer GI20. The structure of FIG. 11 may be identical to the structure of FIG. 10, except the locations and shapes of the channel layer C21, the source electrode S21, and the drain electrode D21.

Figure 12:
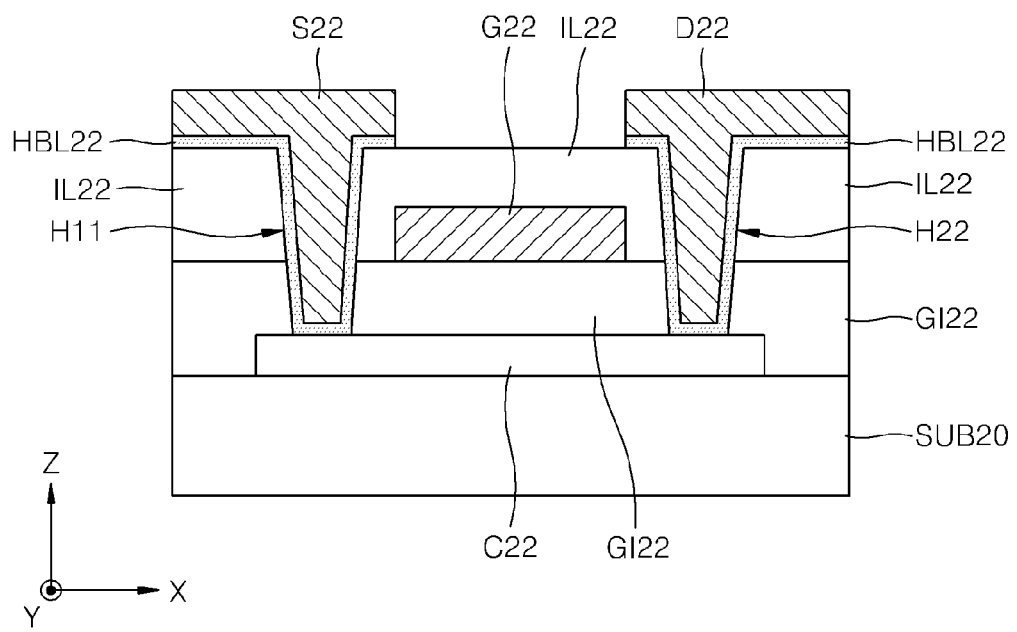

FIG. 12 is a cross-sectional view of a transistor having a top gate structure, according to another example embodiment.

Referring to FIG. 12, a channel layer C22 may be disposed on a substrate SUB20, and a gate insulation layer GI22 may cover the channel layer C22. A gate electrode G22 may be disposed on the gate insulation layer GI22, and an interlayer insulation layer IL22 may cover the gate electrode G22. First and second contact holes H11 and H22 exposing first and second regions of the channel layer C22 may be formed in the interlayer insulation layer IL22 and the gate insulation layer GI22. A source electrode S22 may be disposed in the first contact hole H11, and a drain electrode D22 may be disposed in the second contact hole H22. The source and drain electrodes S22 and D22 may extend above the interlayer insulation layer IL22. A hole blocking layer HBL22 may be disposed in at least one of a region between the source electrode S22 and the channel layer C22, and a region between the drain electrode D22 and the channel layer C22. Materials, thicknesses, properties, etc. of the channel layer C22 and the hole blocking layer HBL22 may be the same as or similar to those of the channel layer C10 and the hole blocking layer HBL10 of FIG. 1.

A transistor according to an example embodiment may be used as a switching device or a driving device of a display device, such as a liquid crystal display device or an organic light emitting display device. As described above, since transistors according to example embodiments have excellent performance including, for example, a low off-current and a high sub-threshold slope, a performance of a display device may be improved when the transistor is applied to the display device. Alternatively, the transistors may not only be applied to a display device, but may be used for various purposes in fields of other electronic devices, such as memory devices and logic devices.

Figure 13:
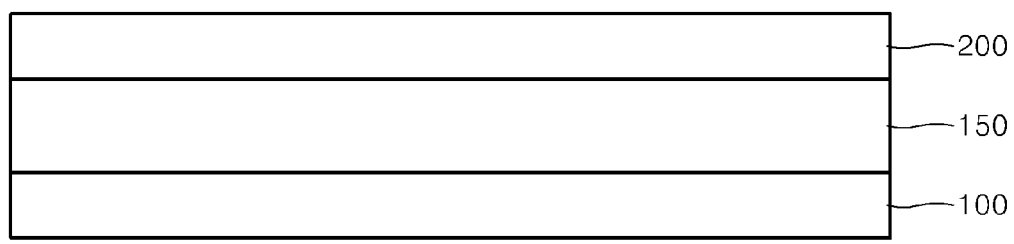
FIG. 13 is a cross-sectional view of an electronic device (display device) including a transistor, according to an example embodiment.

FIG. 13 is a cross-sectional view of an electronic device (display device) including a transistor, according to an example embodiment. The electronic device (display device) of the example embodiment is a liquid crystal display (LCD) device.

Referring to FIG. 13, a liquid crystal layer 150 may be disposed between a first substrate 100 and a second substrate 200. The first substrate 100 may be an array substrate including at least one of the transistors of the example embodiments including, for example, the transistors of FIGS. 1 and 8 through 12, as a switching device or a driving device. The first substrate 100 may include a pixel electrode (not shown) connected to the transistor. The second substrate 200 may include a counter electrode (not shown) corresponding to the pixel electrode. A liquid crystal arrangement of the liquid crystal layer 150 may differ according to a voltage applied between the first and second substrates 100 and 200. The structure of the electronic device including the transistor, according to an example embodiment, is not limited to the structure of FIG. 13, and may vary.

FIGS. 14A through 14E are cross-sectional views for describing a method of manufacturing a transistor, according to an example embodiment. In the example embodiment, a TFT having a bottom gate structure is manufactured.

Figure 14A:
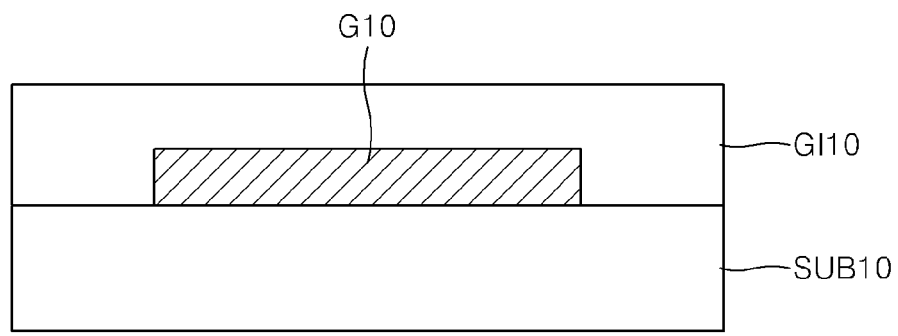
FIGS. 14A through 14E are cross-sectional views for describing a method of manufacturing a transistor, according to an example embodiment.

Referring to FIG. 14A, a gate electrode G10 may be formed on a substrate SUB10, and a gate insulation layer GI10 covering the gate electrode G10 may be formed. The substrate SUB10 may be a glass substrate, but alternatively may be one of various substrates used in a general semiconductor device process, such as a plastic substrate or a silicon substrate, for example. The gate electrode G10 may be a general electrode material, such as a metal or a conductive oxide, for example. The gate insulation layer GI10 may be a silicon oxide, a silicon oxynitride, a silicon nitride, or another material, such as, for example, a high dielectric material having a higher dielectric constant than a silicon nitride. The gate insulation layer GI10 may have a structure in which at least two layers of a silicon oxide layer, a silicon oxynitride layer, a silicon nitride layer, and a high dielectric material layer are stacked on each other.

Figure 14B:
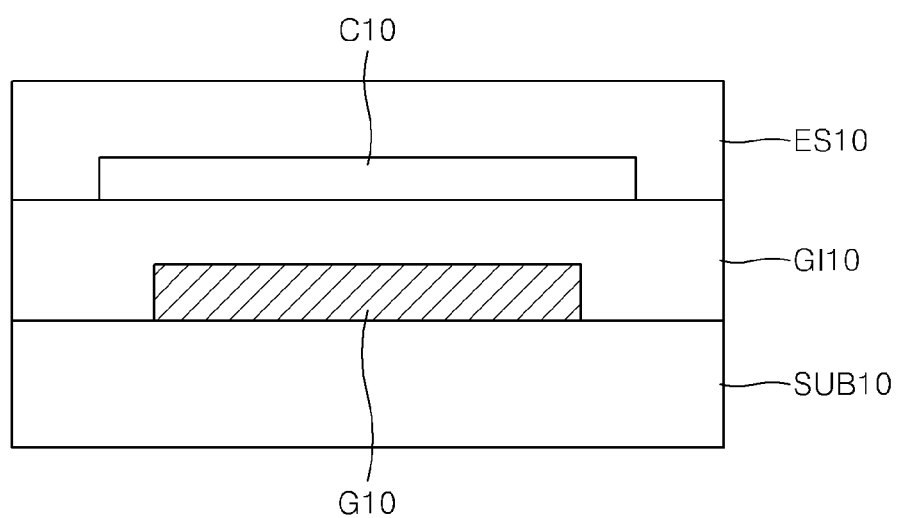

Referring to FIG. 14B, a channel layer C10 may be disposed on the gate insulation layer GI10. The channel layer C10 may be an oxynitride semiconductor. For example, the channel layer C10 may be formed of an oxynitride semiconductor including ZnON. In detail, the channel layer C10 may be a ZnON layer. The channel layer C10 may be obtained by doping a metal element (a metal element other than Zn) on ZnON. The metal element may be Ga, Hf, Al, In, or Sn, for example. An energy band gap of the channel layer C10 may be equal to or higher than 1.3 eV and lower than or equal to 3.3 eV, for example. The thickness of the channel layer C10 may be from about 10 nm to about 150 nm, or about 30 nm to about 100 nm, for example. However, a range of the thickness of the channel layer C10 may vary.

Next, an etch stop layer ES10 covering the channel layer C10 may be formed on the gate insulation layer GI10. The etch stop layer ES10 may be, for example, silicon oxide, silicon nitride, an organic insulation material, or the like.

Figure 14C:
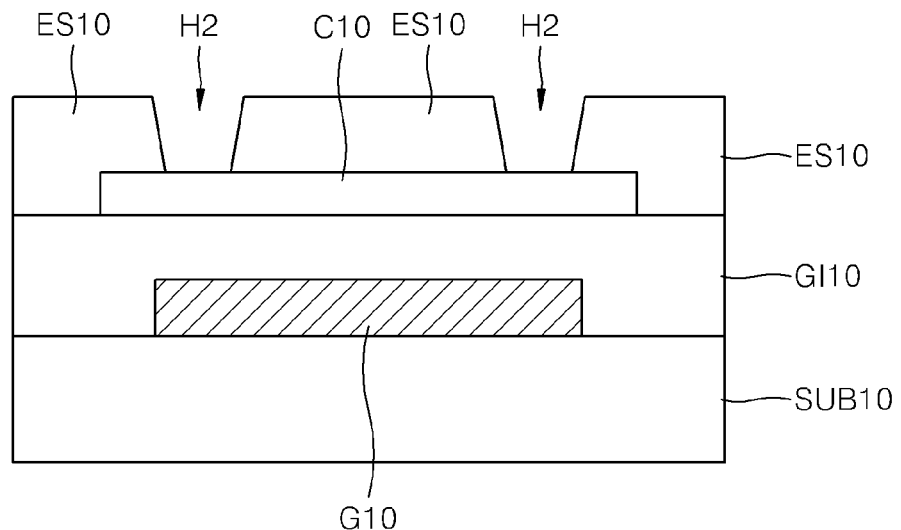

Referring to FIG. 14C, first and second contact holes H1 and H2 may be formed through the etch stop layer ES10. The first and second contact holes H1 and H2 may be formed to respectively expose the first and second regions of the channel layer C10. The first region may be one end of the channel layer C10 or a region adjacent to the end, and the second region may be another end of the channel layer C10 or a region adjacent to the other end.

Figure 14D:
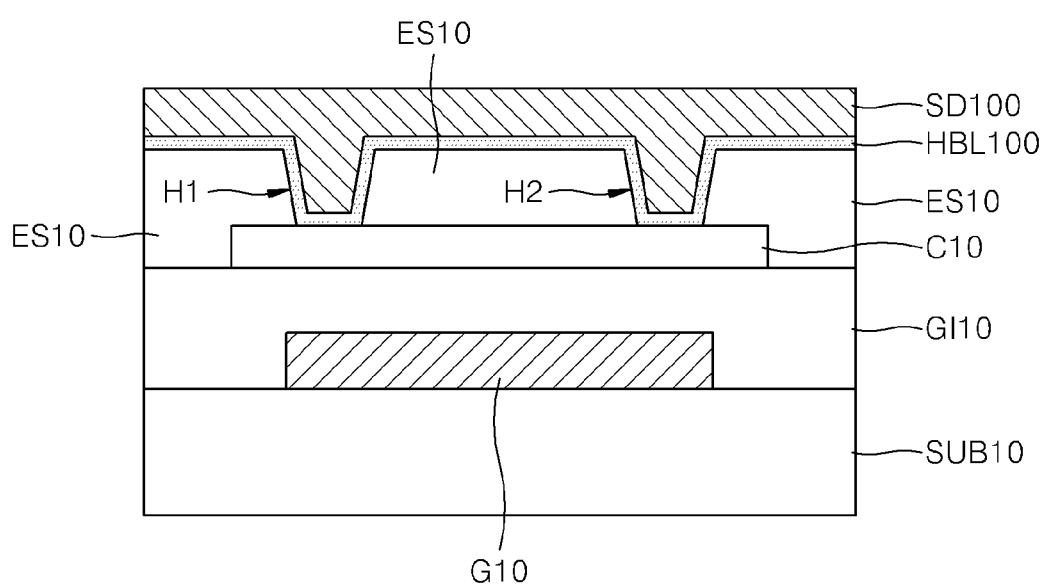

Referring to FIG. 14D, a hole blocking material layer HBL100 may be formed on regions of the channel layer C10 exposed by the first and second contact holes H1 and H2, and the etch stop layer ES10. The hole blocking material layer HBL100 may be formed of a material having a lower valence band maximum energy level than the channel layer C10. Also, the hole blocking material layer HBL100 may be formed of a material having a sum of electron affinity and an energy band gap greater than that of the channel layer C10. Specifically, the hole blocking material layer HBL100 may be formed of one of binary oxides, such as, for example, zinc oxide (ZnO), indium oxide (In2O3), tin oxide (SnO2), titanium oxide (TiO2), gallium oxide (Ga2O3), zirconium oxide (ZrO2), and hafnium oxide (HfO2), or ternary oxides or quaternary oxides formed from at least two oxides of the binary oxides. The ternary oxide may include, for example, InZn oxide (IZO), InSn oxide (ITO), ZnSn oxide (ZTO), GaZn oxide (GZO), HfIn oxide (HIO), ZnTi oxide (ZnTiO), and InTi oxide (InTiO). The quaternary oxide may include, for example, GaInZn oxide (GIZO), HfInZn oxide (HIZO), InZnSn oxide (IZTO), and InGaSn oxide (IGTO). The hole blocking material layer HBL100 may be formed of a mixture of one or more of the above oxides. Alternatively, the hole blocking material layer HBL100 may be formed of an oxynitride. Here, the oxynitride of the hole blocking material layer HBL100 may be the same group as the oxynitride of the channel layer C10. For example, the oxynitride of the hole blocking material layer HBL100 may include ZnON. Here, the oxynitride, such as ZnON, of the hole blocking material layer HBL100 may have a higher oxygen concentration and/or a higher energy band gap than the oxynitride, such as ZnON, of the channel layer C10. The hole blocking material layer HBL100 may be formed of a non-oxide. Here, the hole blocking material layer HBL100 may be formed of GaN, GaAs, GaP, InP, CdTe, CdS, ZnSe, ZnS, ZnTe, AlAs, or a compound thereof, such as AlGaAs, InGaP, or GaAsP, for example. The hole blocking material layer HBL100 may be formed of a mixture of the non-oxides.

A source/drain conductive layer SD100 may be formed on the hole blocking material layer HBL100. The source/drain conductive layer SD100 may be formed of the same material as or a different material from the gate electrode G10. The source/drain conductive layer SD100 may have a single layer or multi-layer.

Next, the source/drain conductive layer SD100 and the hole blocking material layer HBL100 may be patterned (e.g., etched). A resultant structure of such patterning (etching) is shown in FIG. 14E.

Figure 14E:
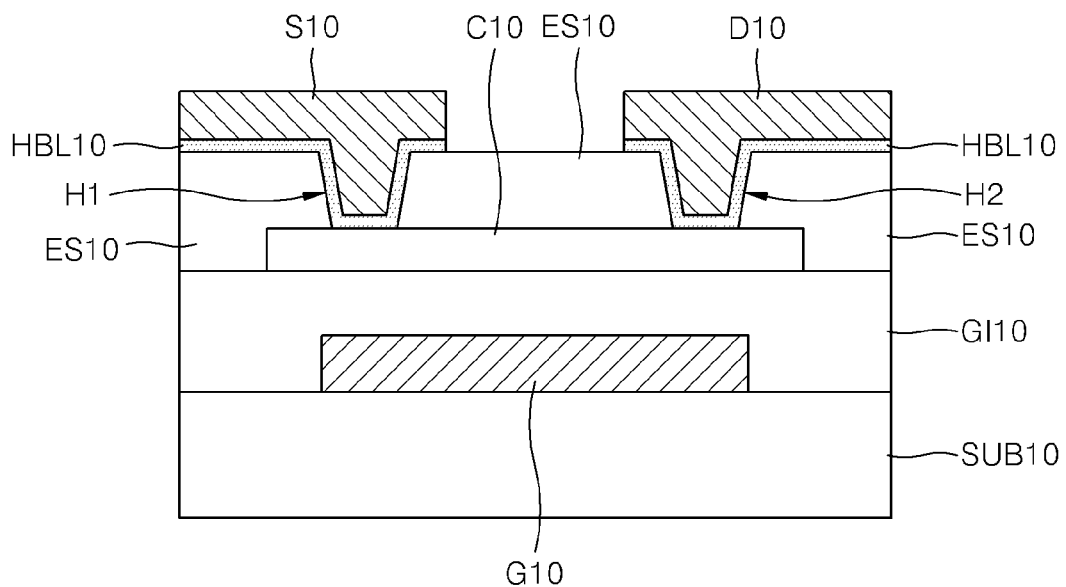

Referring to FIG. 14E, source and drain electrodes S10 and D10 may be formed from the source/drain conductive layer SD100, and the hole blocking layer HBL10 may be formed from the hole blocking material layer HBL100. During the patterning (etching), the etch stop layer ES10 may protect a region of the channel layer C10 between the source and drain electrodes S10 and D10. However, forming of the etch stop layer ES10 is optional.

A passivation layer (not shown) covering the source and drain electrodes S10 and D10 may be formed on the etch stop layer ES10. The passivation layer may be a silicon oxide layer, a silicon oxynitride layer, a silicon nitride layer, or an organic insulation layer, or may have a structure in which at least two thereof are stacked on each other. The transistor formed according to such a method may be annealed at a temperature.

The method described with reference to FIGS. 14A through 14E is an example of a method of manufacturing the transistor of FIG. 1. The transistors of FIGS. 8 and 9 may be manufactured by modifying the method. Since manufacturing of the transistors of FIGS. 8 and 9 may be known to one of ordinary skill in the art based on the method of FIGS. 14A through 14E, details thereof will not be described herein.

Figure 15A:
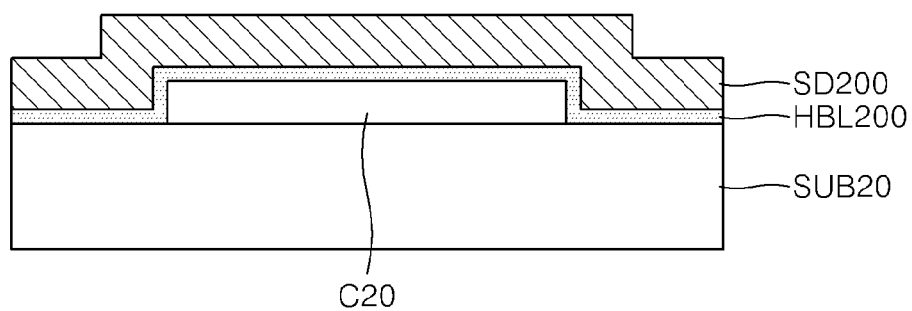
FIGS. 15A through 15C are cross-sectional views for describing a method of manufacturing a transistor, according to an example embodiment.
Figure 15B:
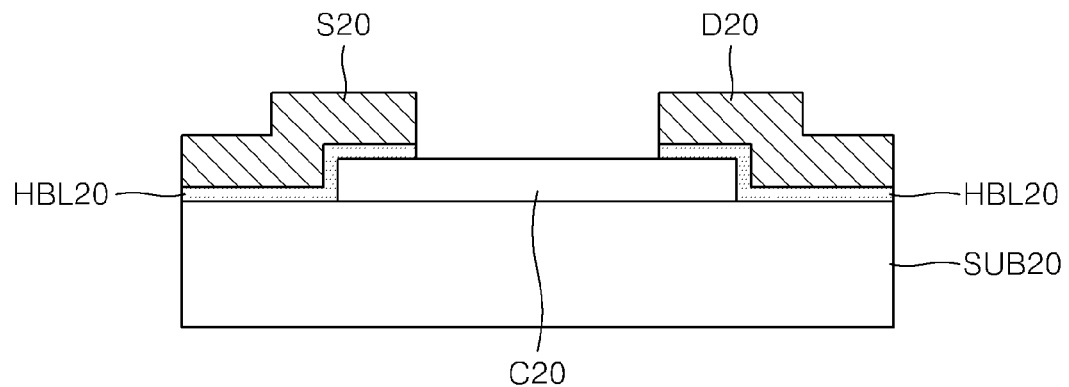
Figure 15C:
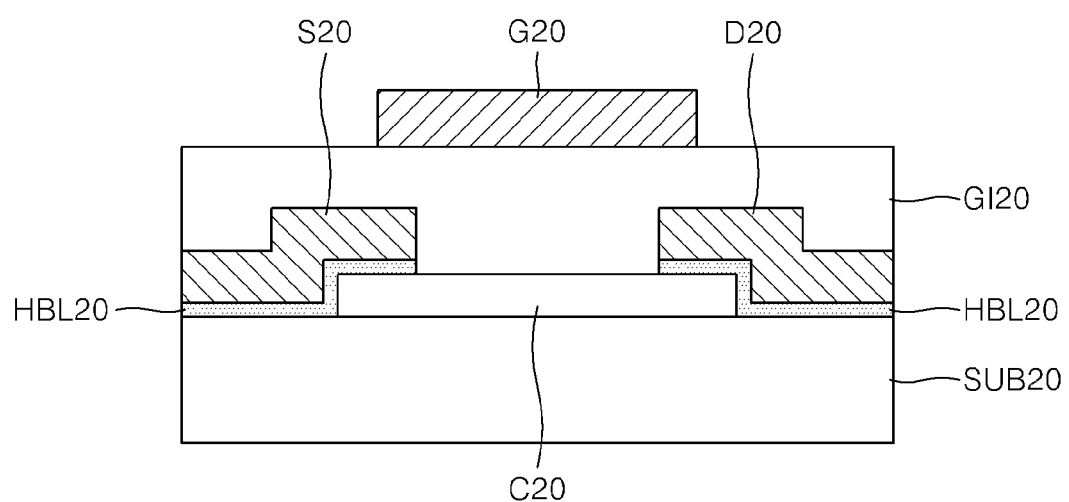

FIGS. 15A through 15C are cross-sectional views for describing a method of manufacturing a transistor, according to an example embodiment. In the example embodiment, a TFT having a top gate structure is manufactured.

Referring to FIG. 15A, a channel layer C20 may be formed on a substrate SUB20. A material, a thickness, properties, etc. of the channel layer C20 may be the same as or similar to the channel layer C10 of FIG. 14B. A hole blocking material layer HBL200 and source/drain conductive layer SD200 covering the channel layer C20 may be formed on the substrate SUB20. Materials of the hole blocking material layer HBL200 and the source/drain conductive layer SD200 may be respectively the same as or similar to the hole blocking material layer HBL100 and the source/drain conductive layer SD100 of FIG. 14D.

Next, the hole blocking material layer HBL200 and the source/drain conductive layer SD200 may be patterned to form a source electrode S20, a drain electrode D20, and a hole blocking layer HBL20 shown in FIG. 15B.

Referring to FIG. 15C, a gate insulation layer GI20 covering the channel layer C20, the source electrode S20, and the drain electrode D20 may be formed. The gate insulation layer GI20 may be formed of the same or similar material as the gate insulation layer GI10 of FIG. 14A. Next, a gate electrode G20 may be formed on the gate insulation layer GI20. The gate electrode G20 may be formed above the channel layer C20. The gate electrode G20 may be formed of the same or different material from the source and drain electrodes S20 and D20. A passivation layer (not shown) covering the gate electrode G20 may be formed on the gate insulation layer GI20. The passivation layer may be a silicon oxide layer, a silicon oxynitride layer, a silicon nitride layer, or an organic insulation layer, or may have a structure wherein at least two thereof are stacked on each other, for example. The transistor formed as such may be annealed at a temperature.

The method of FIGS. 15A through 15C is an example of a method of manufacturing the transistor of FIG. 10. The transistors of FIGS. 11 and 12 may be manufactured by modifying the method. Since manufacturing of the transistors of FIGS. 11 and 12 may be known to one of ordinary skill in the art based on the method of FIGS. 15A through 15C, details thereof will not be described herein.

As described above, according to the one or more of the above example embodiments, the transistor including the oxynitride semiconductor as a channel material and having excellent performance can be easily manufactured.

It should be understood that the example embodiments described herein should be considered in a descriptive sense only and not for purposes of limitation. For example, it would be obvious to one of ordinary skill in the art that elements and structures of the transistors of FIGS. 1 and 8 through 12 may vary. In detail, the channel layer may have a multi-layer structure, and in this case, one of a plurality of layers forming the channel layer may be an oxynitride-based (e.g., ZnON-based) semiconductor layer as described above. Also, the transistor according to an embodiment may have a double gate structure. Also, the methods of FIGS. 14A through 14E and FIGS. 15A through 15C may be variously modified. For example, in the methods of FIGS. 14A through 14E and FIGS. 15A through 15C, at least one of 1) the hole blocking layer HBL10 or HBL20 between the source electrode S10 or S20 and the channel layer C10 or C20, and 2) the hole blocking layer HBL10 or HBL20 between the drain electrode D10 or D20 and the channel layer C10 or C20 may not be formed. The method may be modified in other ways. Also, the transistor according to an embodiment may be applied to one of various electronic devices other than the display device of FIG. 13, for various purposes. Accordingly, descriptions of features or aspects within each embodiment should typically be considered as available for other similar features or aspects in other embodiments.

While example embodiments have been particularly shown and described, it will be understood by one of ordinary skill in the art that variations in form and detail may be made therein without departing from the spirit and scope of the claims

What is claimed is:

1. A transistor comprising:
   a channel layer comprising an oxynitride semiconductor;
   a gate electrode corresponding to the channel layer;
   a source electrode connected to a first region of the channel layer;
   a drain electrode connected to a second region of the channel layer;
   a hole blocking layer disposed between the channel layer and at least one of the source electrode and the drain electrode; and
   a current flowing region between the channel layer and at least one of the source and drain electrodes, the hole blocking layer being in the current flowing region, and the hole blocking layer being configured to allow a flow of electrons;
   wherein at least one of the source and drain electrodes has no region in direct contact with the channel layer due to the hole blocking layer.

2. The transistor of claim 1, wherein the oxynitride semiconductor includes zinc oxynitride (ZnON).

3. The transistor of claim 2, wherein the oxynitride semiconductor further includes at least one metal element other than Zn.

4. The transistor of claim 1, wherein an energy band gap of the oxynitride semiconductor is from about 1.3 eV to about 3.3 eV.

5. The transistor of claim 1, wherein a valence band maximum energy level of the hole blocking layer is lower than a valance band maximum energy level of the channel layer.

6. The transistor of claim 1, wherein a sum of electron affinity and an energy band gap of the hole blocking layer is greater than a sum of electron affinity and an energy band gap of the channel layer.

7. The transistor of claim 5, wherein a conduction band minimum energy level of the hole blocking layer is lower than or equal to a conduction band minimum energy level of the channel layer.

8. The transistor of claim 5, wherein a conduction band minimum energy level of the hole blocking layer is higher than a conduction band minimum energy level of the channel layer, and the hole blocking layer has a thickness configured to allow tunneling of electrons.

9. The transistor of claim 1, wherein the hole blocking layer is configured to reduce an off-current of the transistor.

10. The transistor of claim 1, wherein the hole blocking layer is configured to increase a sub-threshold slope of the transistor.

11. The transistor of claim 1, wherein the hole blocking layer includes an oxide.

12. The transistor of claim 11, wherein the oxide includes at least one of zinc (Zn) oxide, indium (In) oxide, tin (Sn) oxide, titanium (Ti) oxide, gallium (Ga) oxide, zirconium (Zr) oxide, hafnium (Hf) oxide, InZn oxide, InSn oxide, ZnSn oxide, GaZn oxide, HfIn oxide, ZnTi oxide, InTi oxide, GaInZn oxide, HfInZn oxide, InZnSn oxide, InGaSn oxide, and mixtures thereof.

13. The transistor of claim 1, wherein the hole blocking layer includes oxynitride.

14. The transistor of claim 13, wherein the oxynitride of the hole blocking layer is a same group as the oxynitride of the channel layer.

15. The transistor of claim 13, wherein the oxynitride of the hole blocking layer has a larger energy band gap than the oxynitride of the channel layer.

16. The transistor of claim 13, wherein the oxynitride of the hole blocking layer has a higher oxygen concentration than the oxynitride of the channel layer.

17. The transistor of claim 1, wherein the hole blocking layer includes a non-oxide.

18. The transistor of claim 17, wherein the hole blocking layer includes at least one of gallium nitride (GaN), gallium arsenide (GaAs), gallium phosphide (GaP), indium phosphide (InP), cadmium telluride (CdTe), cadmium sulfide (CdS), zinc selenide (ZnSe), zinc sulfide (ZnS), zinc telluride (ZnTe), aluminum arsenide (AlAs), aluminum gallium arsenide (AlGaAs), indium gallium phosphide (InGaP), gallium arsenide phosphide (GaAsP), and mixtures thereof.

19. The transistor of claim 1, wherein the hole blocking layer has a thickness of about 0.5 nm to about 500 nm.

20. The transistor of claim 1, wherein the hole blocking layer has a thickness of about 1 nm to about 20 nm.

21. The transistor of claim 1, wherein the hole blocking layer is between the channel layer and the source electrode, and the hole blocking layer is between the channel layer and the drain electrode.

22. The transistor of claim 1, wherein the gate electrode is disposed below the channel layer.

23. The transistor of claim 22, further comprising:
an etch stop layer disposed on the channel layer.

24. The transistor of claim 1, wherein the gate electrode is disposed above the channel layer.

25. An electronic device comprising the transistor of claim 1.

26. The electronic device of claim 25, wherein the electronic device is a display device.

27. The electronic device of claim 26, wherein the display device is a liquid crystal display device or an organic light emitting display device.

28. The electronic device of claim 25, wherein the transistor is used as a switching device or a driving device.

29. The transistor of claim 1, wherein a center portion of the channel layer does not overlap the hole blocking layer.

* * * * *